(12) United States Patent
Gupta et al.

(10) Patent No.: US 8,624,623 B2
(45) Date of Patent: Jan. 7, 2014

(54) APPARATUS HAVING ERROR DETECTION IN SEQUENTIAL LOGIC

(75) Inventors: Navneet Gupta, Ghaziabad (IN); Prashant Dubey, Greater Noida (IN); Kaushik Saha, Delhi (IN); AtulKumar Kashyap, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/340,674

(22) Filed: Dec. 30, 2011

(65) Prior Publication Data

US 2013/0169360 A1 Jul. 4, 2013

(51) Int. Cl.
*H03K 19/003* (2006.01)
*H03K 19/173* (2006.01)

(52) U.S. Cl.
USPC .............. 326/9; 326/14; 326/46; 326/93

(58) Field of Classification Search
USPC ................................. 326/9–13, 46
See application file for complete search history.

(56) References Cited

U.S. PATENT DOCUMENTS

| | | | | |
|---|---|---|---|---|
| 2004/0223386 A1* | 11/2004 | Mudge et al. | ................. | 365/202 |
| 2009/0315601 A1* | 12/2009 | Priel et al. | ..................... | 327/161 |
| 2010/0165767 A1* | 7/2010 | Lin et al. | ....................... | 365/203 |

* cited by examiner

*Primary Examiner* — Jany Richardson
(74) *Attorney, Agent, or Firm* — Graybeal Jackson LLP

(57) ABSTRACT

According to an embodiment, an apparatus includes: a first node configured to receive a data input signal of a data latch; a second node configured to receive a data output signal of the data latch; process and hold circuitry configured to process a difference between a value of the data input signal received at the first node and a value of the data output signal received at the second node and hold respective values at the first and second nodes responsive to the difference; and comparison circuitry configured to compare the value held at the first node and a value of the data output signal of the data latch; wherein the process and hold circuitry is configured to be biased toward the signal received at one of the first node and the second node.

25 Claims, 8 Drawing Sheets

APPARATUS HAVING ERROR DETECTION IN SEQUENTIAL LOGIC

TECHNICAL FIELD

An embodiment relates to error detection. Particularly, but not exclusively, an embodiment may relate to detection of errors in sequential logic.

BACKGROUND

Sequential logic such as flip-flops or data latches may output and hold a value corresponding to a data input signal. This may be in response to an operable clock edge. In order for a value to be output correctly, a data input signal should adhere to a certain conditions, for example, set-up and hold time for the latch. The set-up time is the period of time prior to the operable clock edge that the data input signal should hold its value in order to be clocked out correctly. The hold time is the period of time after an operable clock edge the data signal input should hold its value in order to be clocked out correctly.

Sequential logic, for example, data latches, may be implemented in systems where dynamic scaling is used. In such systems, a system voltage and/or frequency may be adjusted until the system is close to failure in order to attain a performance payoff, for example power savings. In such systems, a frequency and or voltage, directly or indirectly provided to the latch, may be adjusted such that the set-up and hold times of a data input signal are as close as possible to minimum set-up and hold times of a latch.

In some systems, the sequential logic may be monitored to detect a failure. In some systems, this monitoring may be implemented as a shadow latch in conjunction with the sequential logic clocking the data through. The shadow latch may be made closer to failure than the sequential logic under similar conditions. For example, minimum set-up and hold times of the shadow latch may be longer than the minimum set-up and hold times of the sequential logic. The shadow latch may indicate that it has failed, and the system may stop scaling the voltage and or frequency to prevent the failure of the sequential logic.

In these systems, the minimum set-up and hold times of the shadow latch may be set according to a limit as to how close to failure the sequential logic may be driven. Additionally, such shadow latches consume power and take up space.

SUMMARY

According to an embodiment, an apparatus includes: a first node configured to receive a data input signal of a data latch; a second node configured to receive a data output signal of the data latch; process and hold circuitry configured to process a difference between a value of the data input signal received at the first node and a value of the data output signal received at the second node and hold respective values at the first and second nodes responsive to the difference; and comparison circuitry configured to compare the value held at the first node and a value of the data output signal of the data latch; wherein the process and hold circuitry is configured to be biased toward the signal received at one of the first node and the second node.

The process and hold circuitry may be configured to determine the value held at the first node in response to the value of the signal received at the biased-toward node. The value held at the first node may be determined by the value of the signal received at the biased-toward node when the value of the data input signal received at the first node and the value of the data output signal received at the second node correspond to one another.

The process and hold circuitry may include: a first inverter having an input coupled to the first node and an output coupled to the second node; and a second inverter having an input coupled to the second node and an output coupled to the first node; wherein one of the first and second inverter is stronger than the other one of the second and first inverter. The process and hold circuitry may be biased towards the signal received at the node corresponding to the input of the stronger inverter.

The comparison circuit may be further configured to generate an error signal based on the comparison. The process and hold circuit may be configured to operate in response to a clock signal. The process and hold circuit may be configured to operate in response to an operable clock edge.

The first and second nodes may follow the data input and output signals respectively for a first part of a clock cycle, and may be held at their respective values by the process and hold circuitry for a second part of the clock cycle. The comparison circuitry may be configured to carry out the comparison in the second part of the clock cycle.

The apparatus may be a shadow latch. The data input signal may be a differential data input signal.

According to an embodiment, a method includes: receiving a data input signal of a data latch at a first node; receiving a data output signal of the data latch at a second node; processing a difference between a value of the data input signal at the first node and a value of the data output signal at the second node and holding respective values at the first and second nodes responsive to the difference with process and hold circuitry; and comparing the value held at the first node and a value of the data output signal of the data latch; wherein the process and hold circuitry is biased toward the signal received at one of the first node and the second node.

The method may further include: determining the value held at the first node responsive to the value of the biased-toward signal. The method may include: determining the value held at the first node responsive to the value of the signal received at the biased-toward node when the value of the data input signal received at the first node and the value of the data output signal received at the second node correspond to one another.

The method may include: holding a value at the second node corresponding to an inverted value of the first node; and holding a value at the first node corresponding to an inverted value of the second node.

The method may further include when the data input signal received at the first node and the data output signal received at the second node correspond to one another: holding the value of the biased toward signal at the one of the first node and second node corresponding to the biased toward signal; and holding a value opposite to the value of the biased toward signal at the other one of the second node and first node.

The method may further include: generating an error signal based on the comparison. The method may further include: processing the difference between the value of the data input signal at the first node and the value of the data output signal at the second node and holding the respective first and second nodes at a value responsive to the difference in response to a clock signal. The method may further include: processing the difference between the value of the data input signal at the first node and the value of the data output signal at the second node and holding the respective first and second node at a value responsive to the difference in response to an operable clock edge.

The method may further include: following the data input and output signals at the first and second nodes respectively for a first part of a clock cycle; and holding the respective values at the first and second nodes for a second part of the clock cycle. The method may further include: carrying out the comparison in the second part of the clock cycle.

According to an embodiment, an apparatus includes: a first latch configured to clock a value of a data input signal out to provide a value on a data output signal; and a second latch coupled to the first latch, the second latch including: a first node for receiving the data input signal; a second node for receiving the data output signal; process and hold circuitry configured to process a difference between a value of the data input signal received at the first node and a value of the data output signal received at the second node and hold respective values at the first and second nodes responsive to the difference; and comparison circuitry configured to compare a value held at the first node and a value of the data output signal; wherein the process and hold circuitry is configured to be biased toward the signal received at one of the first node and the second node.

According to an embodiment, an apparatus includes: first input means for receiving a data input signal of a data latch; second input means for receiving a data output signal of the data latch; process and hold means for processing a difference between a value of the data input signal received at the first node and a value of the data output signal received at the second node and holding respective values at the first and second nodes responsive to the difference; and comparison means for comparing a value held at the first node and a value of the data output signal of the data latch; wherein the process and hold means is biased toward the signal received at one of the first node and the second node.

BRIEF DESCRIPTION OF THE DRAWINGS

One or more embodiments will now be described in a non-limiting manner with reference to the following drawings, in which.

DETAILED DESCRIPTION

Described are one or more embodiments of a shadow latch that may be implemented in conjunction with sequential logic and may detect when an error has occurred. An embodiment may use this detection to correct the error. In an embodiment the sequential logic may be a data latch.

In an embodiment, the shadow latch may be configured to compare a value that a data output signal of the sequential logic should have if there has been no error to a value of the data output signal.

The shadow latch may compare a value held at a first node and a value of a data output signal of the sequential logic to determine if an error has occurred. The value held at the first node may correspond to a value of a data input signal of the sequential logic at an operation of the sequential logic. The operation may be clocking out a value of the data input signal to the data output signal. In an embodiment, the operation may be carried out in response to a clock edge.

In an embodiment, a first node of the shadow latch may receive a data input signal Din and hold a value corresponding to the value of the data input signal Din at a time of operation of the sequential logic.

In an embodiment, the held value may be determined by processing and holding a difference between a value at the first node and a value at a second node of the shadow latch. The second node may receive a data output signal Dout of the sequential logic. The value of the data output signal Dout may correspond to a value of the data input signal Din at a preceding operation of the sequential logic.

The shadow latch may be biased towards an input at the first node or be biased towards an input at the second node. For example, when the first and the second inputs are the same, the shadow latch may hold a value of the first node in accordance with the first input or in accordance with the second input depending on the biasing.

In some embodiments, the first node and the second node may follow the data input signal and the data output signal during a first part of a clock cycle, and a value may be held at the first node during a second part of the clock cycle. In an embodiment, the first part of the clock cycle may be before an operation of the sequential logic and the second part of the clock cycle may be after the operation of the sequential logic.

It is appreciated that the shadow latch may be implemented in a variety of manners. Example implementations of the shadow latch and circuitry in accordance with one or more embodiments are described below with reference to the accompanying figures.

Figure 1:
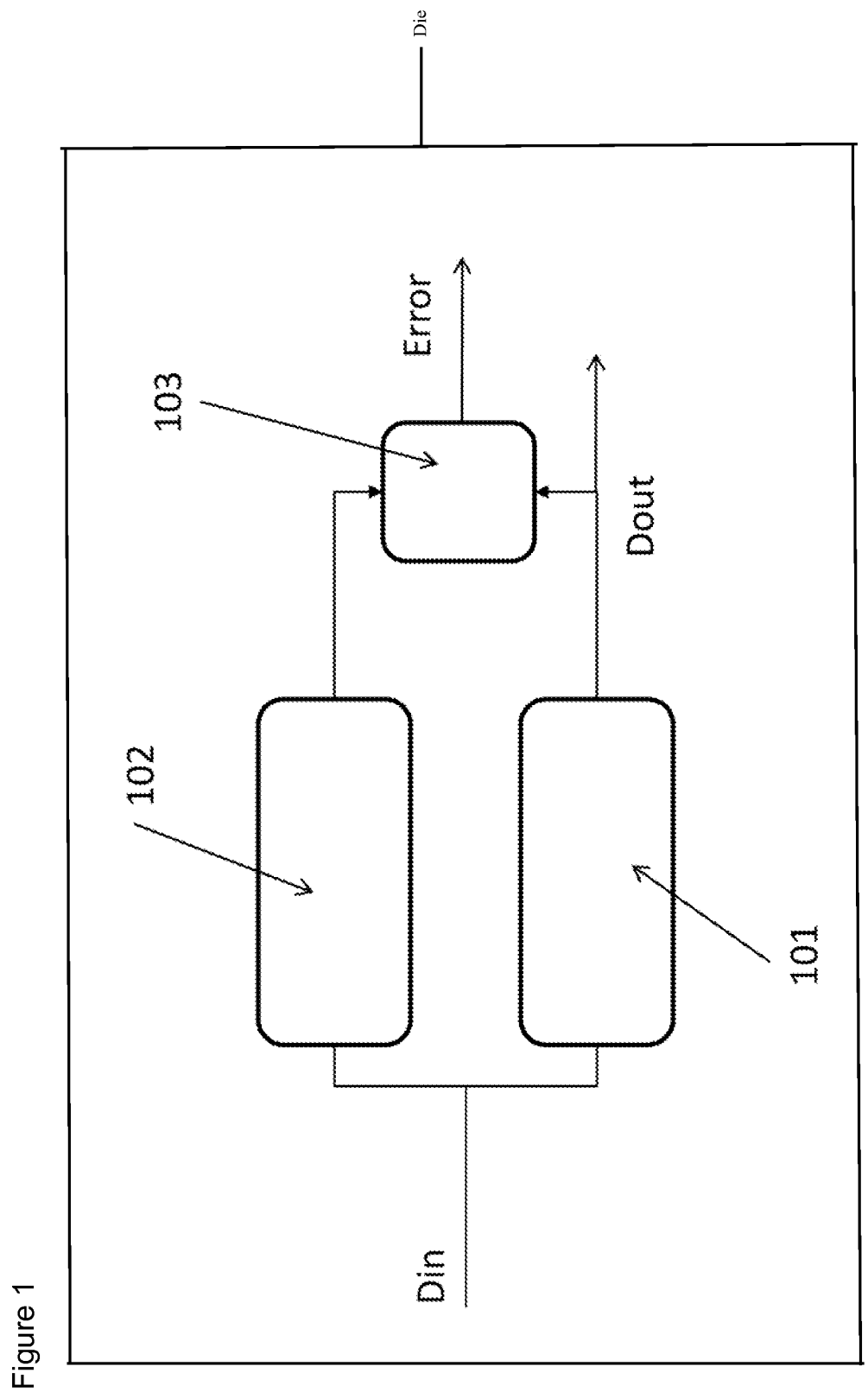
FIG. 1 is a diagram of a system according to an embodiment.

FIG. 1 is a diagram of an example system in which an embodiment may be implemented.

FIG. 1 shows a data latch 101, which receives a data input signal Din and outputs a data output signal Dout. The signal Dout corresponds to a value of the data input signal Din output on an operable edge of a clock signal (not shown in FIG. 1). It is appreciated that the operable edge may be a rising edge and/or a falling edge of the clock signal. The data latch 101 may be any form of suitable sequential logic and, in an embodiment, forms part of a sequential logic path for propagating data. In an embodiment, the data latch 101 may form part of a critical path.

FIG. 1 also shows a shadow latch 102. The shadow latch 102 may be coupled to the data input signal Din and may be coupled to the data output signal Dout. The shadow latch 102 may provide an output to an error detection or comparison circuit 103. The error detection circuit 103 may receive a further input from the data output signal Dout from the data latch 101. The error detection circuit 103 may provide an error output.

In operation, the data latch 101 may receive the data input signal Din. The data flip-flop may clock out a data value D of the data input signal Din at an operable clock edge to provide the data output signal Dout. The data output signal Dout may hold a value Q−1 corresponding to the data value D−1 of the data input signal Din at a previous operable clock edge. The data value may be clocked out correctly to provide a value on the data output signal Dout, in which case the value of the data output signal will correspond to the data value on the data input signal at the operable clock edge, or the data value may be clocked out erroneously, in which case the value of the data output signal Dout may not correspond to the data value of the data input signal D at the operable clock edge.

The shadow latch 102 may also receive the data input signal Din at a first node. In an embodiment, the first node of the shadow latch 102 may follow a data value D of the data input signal Din during a first part of a clock cycle. The shadow latch 102 may also provide the data output signal Dout at a second node. The second node may follow a data value (Q−1) of the data output signal Dout for the first part of the clock cycle.

It is appreciated that in an embodiment, the first part of the clock cycle may be before an operable clock edge, and the value (Q−1) of the data output signal Dout may correspond to a value D−1 of the data input signal Din at a preceding operable clock edge.

In an embodiment, the shadow latch 102 may amplify and hold a difference between a value D of the data signal Din received at the first node and a value (Q−1) of the data input signal Dout received at a second node. This may take place in a second part of a clock cycle. The data input signal Din and data output signal Dout may provide initial values at the first and second nodes. The amplify and hold circuit may amplify a difference between these initial values and hold the first and second nodes at values corresponding to the amplified difference.

In an embodiments, the value D of the data signal Din and the value (Q−1)) of the data output signal Dout may be passed to the amplify and hold circuitry of the shadow latch 102 at the second part of the clock cycle. In an embodiment, the values may be passed to the shadow latch 102 at an operable clock edge. In an embodiment, because the shadow latch 102 amplifies and holds a difference between the initial value of the first node and initial value of the second node, the shadow latch may be less likely to fail than the data latch.

For example, in an embodiment, if the data signal D transitions very closely to the operable clock edge, and the initial value passed to the shadow latch is only half way through the transition, then the shadow latch amplifies the difference and may provide an output equivalent to the fully transitioned data signal. The shadow latch 102 may be faster than the data latch 101. In an embodiment, this may be due to the amplify and hold circuitry of the shadow latch 102. In an embodiment, the minimum set-up and hold margins of the shadow latch 102 may be less than the set-up and hold margins of the data latch 101.

The shadow latch 102 may be imbalanced. In an embodiment, the shadow latch 102 may be biased towards either the input at the first node or the input at the second node. For example, when the inputs at the first and second nodes are the same, the shadow latch may hold a value at the first node determined by the input biased towards. For example, if the shadow latch is biased towards the input at the first node, then the shadow latch may hold the first node at a value corresponding to the input value. If the shadow latch is biased towards the input at the second node, then the shadow latch may hold a value at the second node corresponding to the input at the second node and hold a value at the first node at a value determined by the input at the second node.

The imbalance of the shadow latch may be considered to have the biased toward node as stronger than the other node. For example, in a case where the value D of the data input signal Din and the value (Q−1) of the data output signal Dout corresponding to the previously clocked out value (D−1) of the data input signal Din are the same, then the initial values at the first and second node are the same. The shadow latch may be imbalanced such that in this case, one node will be the stronger input and force the other node to an opposite value. For example if both nodes are initially a high, the stronger node may flip the weaker node to a low. It will be appreciated that either node may be set as the stronger node.

For example, in a case where the value (Q−1) of the data output signal Dout and the value D of the data input signal Din correspond, i.e., equal, one another, the shadow latch may invert the second node. This may occur, for example, where the value of the data input signal Din remains the same over two or more clock cycles and the first node is the stronger input.

It is appreciated that in an embodiment, the shadow latch and/or data latch may be a differential latch. For example, the data latch may receive a differential data input signal and clock out a differential data output signal. In an embodiment, the shadow latch may receive the differential data input signal(s) at first nodes and the differential data output signal(s) at second nodes. The shadow latch may be imbalanced, for example, such that it is biased towards the input at the first nodes or the input at the second nodes.

It is appreciated that the shadow latch may be biased through various means. For example, the circuitry of the shadow latch may be made imbalanced—for example, transistors of the shadow latch may be different sizes. Alternatively or additionally, capacitance may be introduced into the shadow latch and/or a charge may be injected into the shadow latch during a process and hold operation to bias toward one input.

The shadow latch 102 may provide an output to an error detection or comparison circuit 103. The output may be coupled to the first node. The shadow latch may provide a value of the first node held by the shadow latch 102, for example, a value corresponding to a value D of the data input signal Din at the operable clock edge. The error detection circuit 103 may compare the output of the shadow latch 102 with the data output signal Dout output from the data latch 101. It is appreciated that the value (Q−1) of the data output signal Dout may change to a value Q at the clock edge as the value D of the data input signal Din is clocked through the data latch 101.

As the shadow latch 102 may be less likely to fail than the data latch 101, the output from the shadow latch 102 may represent a correct value D of the data output signal Dout (in other words the value that the data output signal should have if the data has been clocked out without error), and the data output signal Dout from the data latch 101 may provide an actual value Q clocked out by the data latch 101.

The error detection circuit 103 may compare the output of the shadow latch 102 to the data output signal Dout and determine whether or not an error has occurred. An error signal may be generated in response to this determination. In an embodiment, the error signal may be provided to further circuitry for correcting the error and/or the error signal may be used to record information about the behavior of the circuit. In an embodiment, the error signal may be used in the control of dynamic scaling of the circuit.

It is appreciated that the data latch 101 and the shadow latch 102 may receive a common clock signal and be clocked on a common clock edge. It is also appreciated that an embodiment may be implemented in systems with frequency and voltage scaling. In other words, an embodiment may be used in systems in which a frequency and/or voltage of the system is adjusted until the system is close to failure.

It is appreciated that the shadow latch 102 may be implemented as an imbalanced differential amplifier. Furthermore, it is appreciated that the error detection circuit 103 may be implemented in a variety of ways. Various embodiments and implementations of the shadow latch 102 and error detection circuitry 103 are described below.

Figure 2:
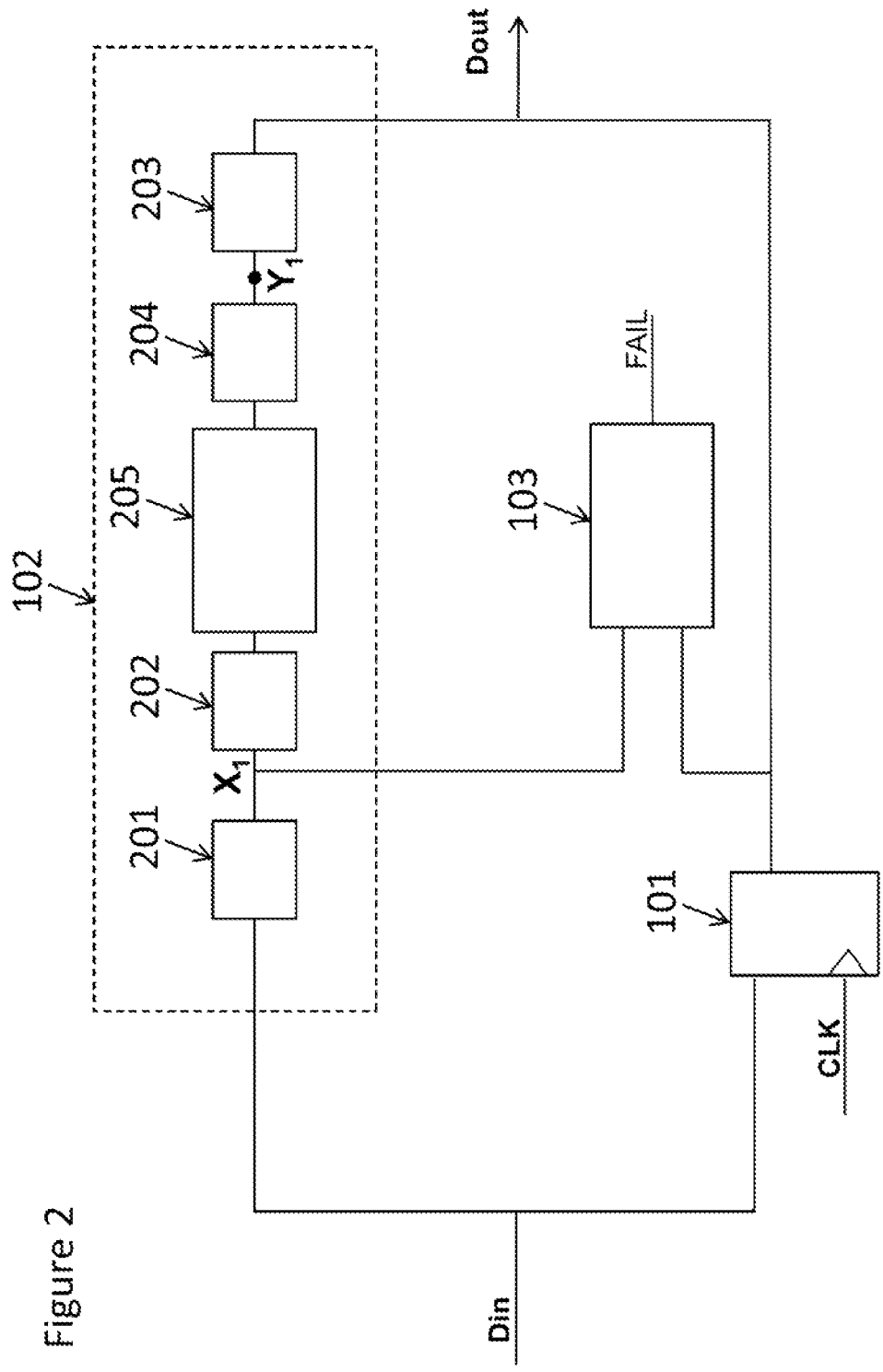
FIG. 2 is a more-detailed diagram of the system of FIG. 1 according to an embodiment.

FIG. 2 is a diagram of an embodiment of an implementation of the circuit of FIG. 1.

FIG. 2 shows a data latch 101, a shadow latch 102, and an error detection circuit 103. It is appreciated that the data latch 101, shadow latch 102, and error detection circuit 103 may correspond to those in FIG. 1.

The data latch 101 receives a clock signal. In an embodiment, the shadow latch 102, error detection circuit 103, and data latch 101 may operate in accordance with a common clock signal.

The shadow latch 102 may include a first switch 201 with a first connection coupled to the data input signal Din. A second connection of the first switch 201 may be coupled to a first node X1. The first node X1 may be coupled to a first connection of a second switch 202 as well as to a first input of the error detection circuit 103. A second connection of the second switch 202 may be coupled to amplify and hold circuitry 205. In an embodiment, the amplify and hold circuitry 205 may be an imbalanced differential amplifier.

The amplify and hold circuitry 205 may be coupled to a first connection of a third switch 204. A second connection of the third switch 204 may be coupled to a second node Y1. The second node Y1 may be further coupled to a first connection of a fourth switch 203. A second connection of the fourth switch 203 may be coupled to the data output signal Dout of the data latch 101.

The data output signal Dout of the data latch 101 may form a second input to the error detection circuit 103. The error detection circuit 103 may provide an output fail signal. It is appreciated that the output fail signal may be any suitable indication, for example, an indication, alert, signal, and/or setting of a flag.

In operation, the first and second switches 201 and 202 may be controlled so that the first node X1 is coupled to the data input signal Din and uncoupled from the amplify and hold circuitry 205 during a first part of a clock cycle. This may be, for example, for at least part of a period when the clock signal is low. The first node X1 may further be coupled to the amplify and hold circuitry 205 and uncoupled from the data input signal Din by the first and second switches 201 and 202 during a second part of a clock cycle. This may be, for example, for at least part of when the clock signal is high.

Similarly, the third and fourth switches 204 and 203 may be controlled so that the second node Y1 may be coupled to the data output signal Dout and uncoupled from the amplify and hold circuitry 205 during the first part of the clock cycle, and uncoupled from the data output signal Dout and coupled to the amplify and hold circuitry 205 during the second part of the clock cycle.

The first 201, second 202, third 204, and fourth 203 switches may operate in accordance with the below table.

TABLE 1

| CLK | 0 | 1 |
|---|---|---|
| S1 | ON | OFF |
| S2 | OFF | ON |
| S3 | OFF | ON |
| S4 | ON | OFF |

The above example of the operation of the first 201, second 202, third 204 and fourth 203 switches is according to a rising edge of the clock signal being the operable clock edge. It is appreciated that for an operable falling edge of the clock or operable dual clock edge, the switch operation may be modified accordingly.

Additionally, the switches may be respectively on and off for only at least part of the first and second parts of the clock cycle, for example, for only a part of the time for which the clock signal is high and/or low.

The circuitry of FIG. 2 may operate in accordance with an embodiment, for example, when the data input signal Din transitions from low to high. In this case, the data input signal Din will go high before an operable rising clock edge. In order for the data latch 101 to clock a data value D on the data input signal Din out correctly, the presence of the data value D must adhere to a set-up margin of the data latch. On the operable rising edge of the clock signal, the high value D of the data input signal Din may be clocked out to provide the data output signal Dout of the data latch 101.

Before the rising edge of the clock, the clock signal is low and the first switch 201 couples the data value D on the data input signal Din to the first node X1. The first node may follow the value D on the data input signal Din while the clock signal is low. When the data input signal Din goes high, the first node X1 goes high. On the rising edge of the clock the first switch 201 turns off and the second switch 202 turns on. This couples the first node X1 to the amplify and hold circuitry 205.

It is appreciated that the first switch 201 and the second switch 202 may not operate instantaneously, and on the operable rising edge of the clock, the value of the data input signal Din at the rising edge will be coupled to the input of the amplify and hold circuitry 205. On the operable clock edge, the amplify and hold circuitry 205 may receive an initial value D on the first node X1 that corresponds to the data value D on the data input signal Din at the rising edge of the clock.

Similarly, when the clock signal is low, the fourth switch 203 may couple the second node Y1 to the data output signal Dout of the data latch 101. It is appreciated that a value (Q−1) of the data output signal Dout may correspond to a data value (D−1) of the data input signal Din clocked out by the data latch 101 at the preceding rising edge of the clock. The second node Y1 may follow the data value (D−1) clocked out of the data latch 101 at the preceding rising edge of the clock.

At the rising edge of the clock, the fourth switch 203 turns off and the third switch 204 turns on, thus coupling the second node Y1 to the amplify and hold circuitry 205.

It is appreciated that the data latch 101 may not instantaneously clock out the new value D of the data input signal Din at an operable clock edge, and the value (Q−1) of the second node corresponding to a value (D−1) of the data input signal Din clocked out by the data latch 101 at the preceding operable clock edge is initially received by the amplify and hold circuitry 205.

After the rising edge of the clock, the first node X1 and the second node Y1 may be uncoupled from the data input signal Din and the data output signal Dout, and, therefore, and will no longer follow them.

The amplify and hold circuitry 205 may take the initial value of the first node X1 and the initial value of the second node Y1 and amplify and hold a difference between the values at the first node X1 and second node Y1. For example, in an embodiment where the data signal transitions from a low to a high, the value at the rising edge of the clock at the first node X1 will initially be high while the data value at the second node Y1 will initially be low. The amplify and hold circuitry 205 may amplify and hold this difference and hold the first node X1 high and the second node Y1 low.

The value held at the first node X1 may be input into the error detection circuit 103 and compared to the data output signal Dout. If the data latch 101 has erroneously clocked out the value of the data input signal D, then the value Q of the data signal output will not correspond to the value of the first node X1. A fail signal may be set to indicate a detected error. But if the data latch 101 has correctly clocked out the value D of the data input signal Din, then the value Q of the data signal output Dout will correspond to the value of the first node X1, and the fail signal may indicate that no error has occurred.

It is appreciated that the fail signal may be the setting of a flag or interrupt. Furthermore in an embodiment, the fail signal may be set to indicate only an error or that no error has occurred.

The amplify and hold circuitry 205 may be imbalanced. For example, the first node X1 may provide a stronger input. For example, in the case when the data signal remains high for two clock cycles, at a second rising edge the value at the first node X1 will be high and the value at the second node Y1 will be high. The high value at the first node X1 may provide a stronger input and force the value of the second node Y1 low.

It is appreciated that the circuit behaves similarly in the case where the data signal transitions from a high to low.

Figure 3:
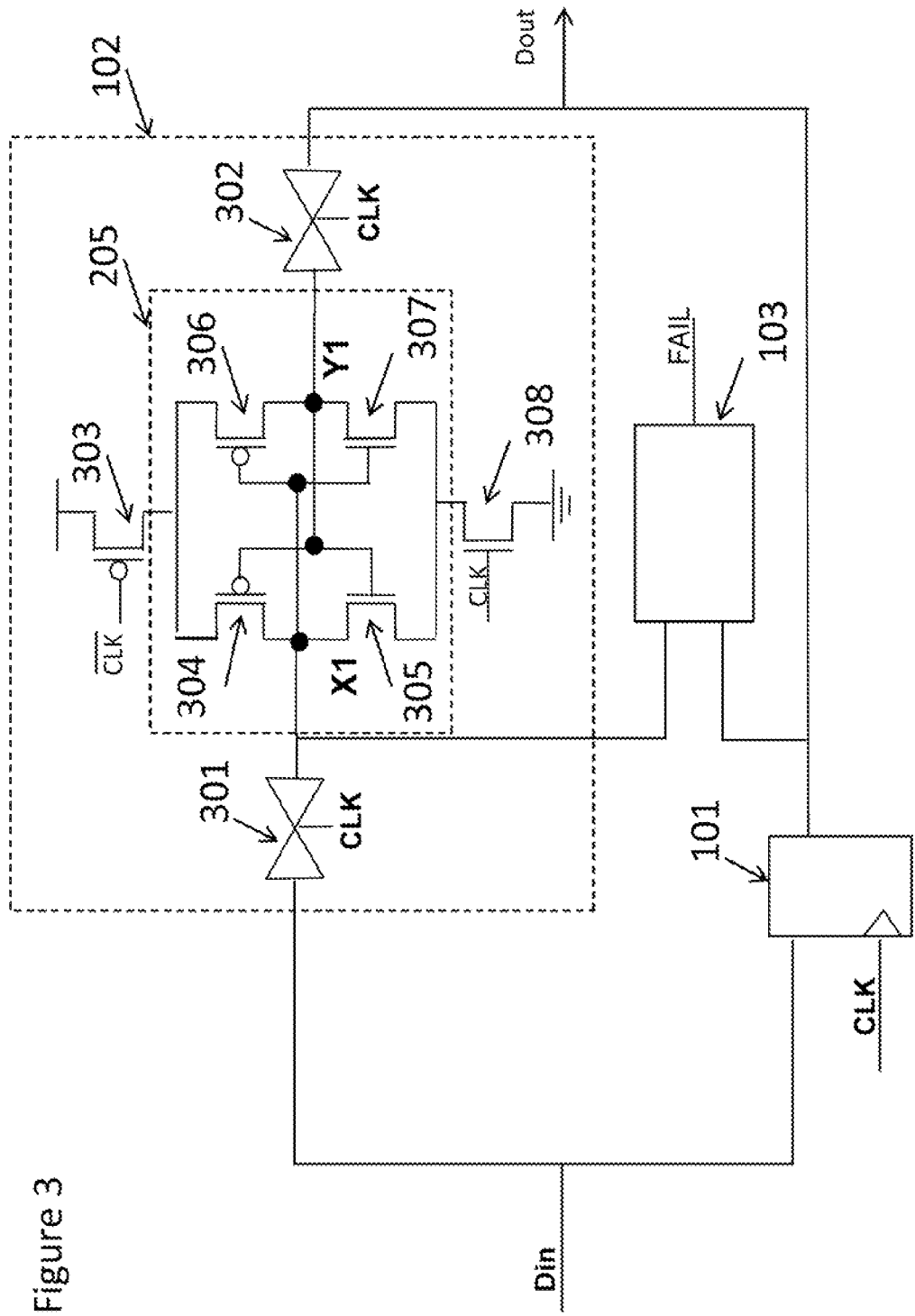
FIG. 3 is a diagram of a system including circuitry of a shadow latch according to an embodiment.

FIG. 3 is a diagram of an example of circuitry for the shadow latch 102. It is appreciated that the data input signal Din, the clock signal CLK, the data latch 101, the data output signal Dout, the nodes X1, Y1, error detection circuit 103, and fail signal may be similar to that of FIG. 2.

The shadow latch 102 of FIG. 3 may include a first switch 301 that receives the clock signal as a control input. The first switch 301 may be coupled between the data input signal Din and the first node X1. The shadow latch 102 may further include a second switch 302, which receives the clock signal as a control input and is coupled between the data output signal Dout and the second node Y1. It is appreciated that switches 301 and 302 may correspond to the first switch 201 and the fourth switch 203 of FIG. 2.

The shadow latch 102 may further include a first p-channel transistor 303 with a source terminal coupled to a voltage source, a drain terminal coupled to a differential amplifier 205, and a gate terminal coupled to an inverted clock signal. The shadow latch 102 may further include a first n-channel transistor 308 with a source terminal coupled to a ground, a drain terminal coupled to the differential amplifier 205, and a gate terminal coupled to the clock signal.

It is appreciated that the transistors 303 and 308 may correspond to the second 202 and third 204 switches of FIG. 2. In other words, the transistors 303 and 308 may enable and/or disable the differential amplifier 205 based on the clock signal.

It is also further appreciated that in an embodiment, the clock signal may be replaced by a clock pulse.

The imbalanced differential amplifier 205 of FIG. 3 may include a second p-channel transistor 304, a second n-channel transistor 305, a third p-channel transistor 306, and a third n-channel transistor 307.

The drain terminal of the first p-channel transistor 303 may be coupled to a source terminal of the second p-channel transistor 304 and a source terminal of the third p-channel transistor 306. The drain terminal of the first n-channel transistor 308 may be coupled to a source terminal of the second n-channel transistor 305 and a source terminal of the third n-channel transistor 307. A gate terminal of the second p-channel transistor 304 may be coupled to a gate terminal of the second n-channel transistor 305.

A drain terminal of the second p-channel transistor 304 may be coupled to a drain terminal of the second n-channel transistor 305, and may be coupled to the first node X1 and to respective gate terminals of the third p-channel transistor 306 and the third n-channel transistor 307.

A drain terminal of the third p-channel transistor 306 may be coupled to a drain terminal of the third n-channel transistor 307, which may be coupled to the second node Y1 and to respective gate terminals of the second p-channel transistor 304 and the second n-channel transistor 305.

The operation of the shadow latch of FIG. 3 will be described with reference to FIGS. 5a and 5b. It is appreciated that in an embodiment, the operation of the circuitry of FIG. 3 may be in line with the operation of the circuitry of FIGS. 1 and 2.

Figure 5A:
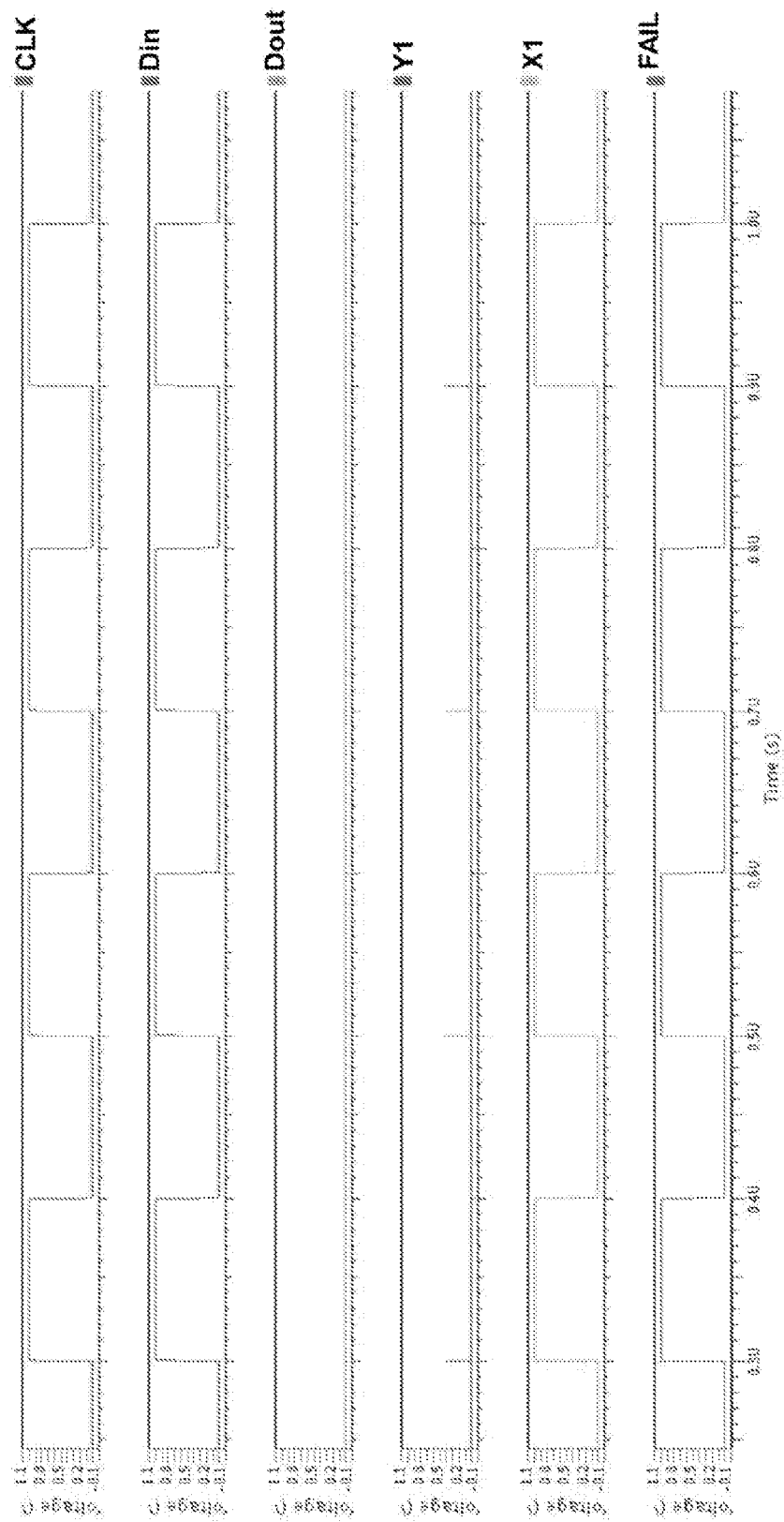
FIG. 5a is a signal diagram for when a data signal transitions from 0 to 1 corresponding to an embodiment.
Figure 5B:
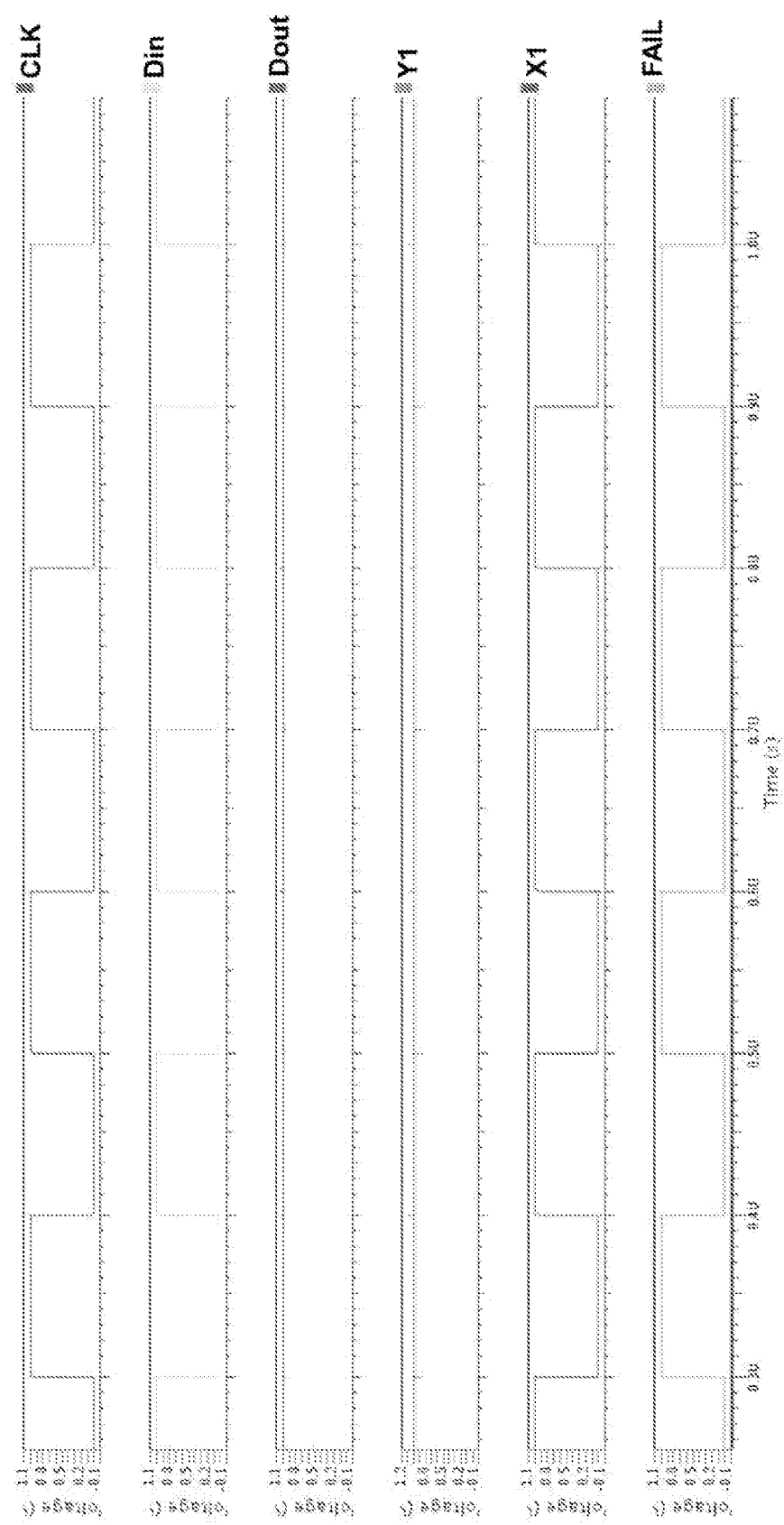
FIG. 5b is a signal diagram for when a data signal transitions from 1 to 0 corresponding to an embodiment.

FIGS. 5a and 5b are timing diagrams of the signals of the circuitry of FIG. 3 according to an embodiment. FIG. 5a shows the signals corresponding to the data input signal Din transitioning from 0 to 1 on an operable clock edge, and FIG. 5b shows the signals corresponding to the data signal transitioning from 1 to 0 on an operable clock edge.

FIG. 5a shows the clock signal CLK, the data input signal Din, the data output signal Dout, the signal at the first node Y1, the signal at the second node X1, and the fail signal FAIL. In an embodiment per FIG. 5a, the rising edge of the clock is considered the operable clock edge; however, it is appreciated that this is by way of example only.

When the clock signal CLK is low, the switches 301 and 302 are closed and the first node X1 is coupled to the data input signal Din and the second node Y1 is coupled to the data output signal Dout.

When the clock signal CLK is low, the first node X1 follows the data input signal Din, and the second node Y1 follows the data output signal Dout. The inverted low clock signal is input to the gate terminal of the first p-channel transistor 303, and the low clock signal is input to the gate terminal of the first n-channel transistor 308. The first p-channel 303 and first n-channel 308 transistors are off, and the differential amplifier 205 is disabled.

In FIG. 5a, the data input signal Din is shown to transition from 0 to 1 on the rising edge of the clock signal CLK. In this example, the data transition of the data signal D may be too close to the rising clock edge to satisfy the set-up time of the data latch 101, and the data latch 101 may clock out the data input signal Din in error.

In FIG. 5a, when the clock signal CLK transitions from 0 to 1, the data latch 101 clocks out the value D of the data input signal Din erroneously as a low, and a value Q of the data output signal Dout is low for that clock cycle. For example at 0.5 μs, the clock signal CLK transitions from low to high and the data latch 101 clocks out the value D of the data signal at 0.5 μs erroneously.

At the rising edge of the clock CLK, the switches 301 and 302 turn off and uncouple the first X1 and second Y1 nodes from the data input signal Din and the data output signal Dout, respectively. The inverted clock signal goes low at the gate of the first p-channel transistor 303, and the first p-channel transistor 303 turns on. Similarly the clock signal at the gate of the first n-channel transistor 308 goes high, and the first n-channel transistor 308 turns on.

The sources of the second p-channel transistor 304 and the third p-channel transistor 306 are pulled high, while the sources of the second and third n-channel transistors 305 and 307 are pulled low. During the time period for the switches 301 and 302 to turn off and while the first p-channel transistor 303 and the first n-channel transistor 308 are on, the value of the first node X1 corresponds to the value D of the data signal Din and the value of the second node Y1 corresponds to the value (Q−1)_of the data output signal Dout. It is appreciated that the value (Q−1) of the second node Y1 corresponds to the value (D−1) of the data input signal Din clocked through the data latch 101 at the preceding operable clock edge.

In the example of FIG. 5a, the value at the first node X1 is high while the value at the second node Y1 is low. The high value of the first node X1 is input to the gates of the third p-channel transistor 306 and the third n-channel transistor 307, which turns the third p-channel transistor 307 off while turning the third n-channel transistor 307 on. The low value at the second node Y1 pulls the gate of the second p-channel transistor 304 and the gate of the second n-channel transistor 305 low, which turns the second n-channel transistor 305 off and the second p-channel transistor 304 on. The second p-channel transistor 304 pulls the first node X1 high while the third n-channel transistor 307 pulls the second node Y1 low.

In this manner, the difference between the initial values of X1 and Y1 at the operable clock edge is amplified and held.

For example, because the data input signal Din transitions so close to the clock edge, the value at node X1 may be half-way through the transition and may be for example half of the high value. The differential amplifier 205 will amplify the difference between the half-high value of X1 and the low value of Y1 pulling the first node X1 high and the second node Y1 low.

The value of the first node X1 is passed to the error detection circuit 103 along with the erroneously clocked out value Q of the data output signal Dout. The error detection circuit 103 may compare the value of the first node X1 and the value Q of the data signal output Dout and determine that an error has occurred. The fail signal FAIL may go high to indicate that an error has been detected.

Similarly, FIG. 5b is a signal timing diagram of the clock signal CLK, the data input signal Din, the data output signal Dout, the signal at the second node Y1, the signal at the first node X1, and the fail signal FAIL for the case where the data input signal D transitions from a 1 to a 0 on an operable clock edge. Similarly to FIG. 5a, the proximity of the data input signal Din transition to the operable clock edge results in a higher likelihood of the data latch 101 clocking out the value D of the data input signal Din incorrectly.

The switches 301 and 302, the first p-channel transistor 303, and the first n-channel transistor 308 may operate according to the clock signal similarly to that of FIG. 5a. On an operable clock edge, the value at the first node X1 is a 0 while the value at the second node Y1 corresponding to the value (D−1) of the data input signal Din clocked out at a preceding clock edge may be 1.

The low value at the first node X1 pulls the gates of the third p-channel transistor 306 and the third n-channel transistor 307 low, turning the third n-channel transistor 307 off and the third p-channel transistor 306 on. The high value at the second node Y1 pulls the gate of the second p-channel transistor 304 and the second n-channel transistor 305 high, turning the second n-channel transistor 305 on and the second p-channel transistor 304 off. The on second n-channel transistor 305 pulls the first node X1 to ground while the on third p-channel transistor 306 pulls the second node Y1 to a high value. The difference between the values at the nodes X1 and Y1 is amplified and held by the differential amplifier 205.

A case may occur where the data value D of the data input signal Din does not transition before a clock edge. For example the value of the data input signal Din may remain as a high value for two clock cycles. In this case, at an operable clock edge around which there are no transitions, the first node X1 will be high corresponding to the value D of the data input signal Din. The value (Q−1) of the data output signal Dout corresponding to the value (D−1) of the data input signal Din clocked through the data latch at the preceding operable clock edge may also be high, such that the value at the second node Y1 may also be high.

The high value at the first node X1 may attempt to pull the gates of the third p-channel transistor 306 and the third n-channel transistor 307 high while the high value at the second node Y1 may try to pull the gates of the second p-channel transistor 304 and the second n-channel transistor 308 high.

In an embodiment, the differential amplifier 205 may be provided as an imbalanced circuit with an input from either the first or second node being the stronger input. In an embodiment, the differential amplifier 205 may be imbalanced to set a default input. For example, the differential amplifier or amplify and hold circuitry may include a first inverter configured to invert a value held at the first node to provide a value at the second node, and a second inverter configured to invert a value of the second node to provide a value at the first node. When the initial values at the first and second nodes are different, the inverters may amplify and hold the difference. However, when the initial values are the same, the amplify and hold circuit may be imbalanced with one of the inverters being a stronger inverter associated with one of the nodes, and the stronger inverter flips the other node to an opposite value.

For example, the differential amplifier 205 may be provided as an imbalanced differential amplifier, with the value of the first node X1 being the stronger input. In this case, the first node X1 pulls the gates of the third p-channel transistor 306 and the third n-channel transistor 307 high, turning the third n-channel transistor 307 on and the third p-channel transistor 306 off.

The third n-channel transistor 307 pulls the second node Y1 low, which pulls the gates of the second p-channel transistor 304 and the second n-channel transistor 305 low, thus turning the second p-channel transistor 304 on and pulling the value of the first node X1 high. Although the initially high value at the second node Y1 may attempt to pull the gates of the second p-channel 304 and second n-channel 305 transistors high, this is overridden by the value at the first node X1.

Similarly, if the data input signal Din is low for two clock cycles, then the first node X1 is kept low while the second node Y1 becomes high.

In an embodiment, a clock pulse may also be generated. The clock pulse may cause the comparison of the first node output and the data output signal to occur when the first and second nodes are uncoupled from the data input and output signals, and/or allow a settling time for the first node output.

In an embodiment, the clock pulse may enable the operation of error detection to ensure that error detection only occurs for a period after an operable clock edge. This may be to ensure that an error is not detected when the first node is following the data input. In an embodiment, the clock pulse may be generated to allow a stabilizing time for the first node X1. For example, X1 may settle into a high or low value, and error detection may occur once the value of the node has settled.

In an embodiment, such a clock pulse may be input at the gates of the first p-channel 303 and n-channel transistors 308, and be used to enable the differential amplifier. In an embodiment, the clock pulse may correspond to an operable edge of a clock signal, and may be active for a period thereafter. In an embodiment, the clock pulse may be generated for varying lengths of time, and may be generated according to a hold margin of the data latch.

It is appreciated that the duration of the pulse may differ in embodiments. For example, the pulse may be high for only part of the period for which the clock is high.

Examples of the use of the clock signal, clock pulse, and implementation of the error detection circuitry are discussed below.

Figure 4A:
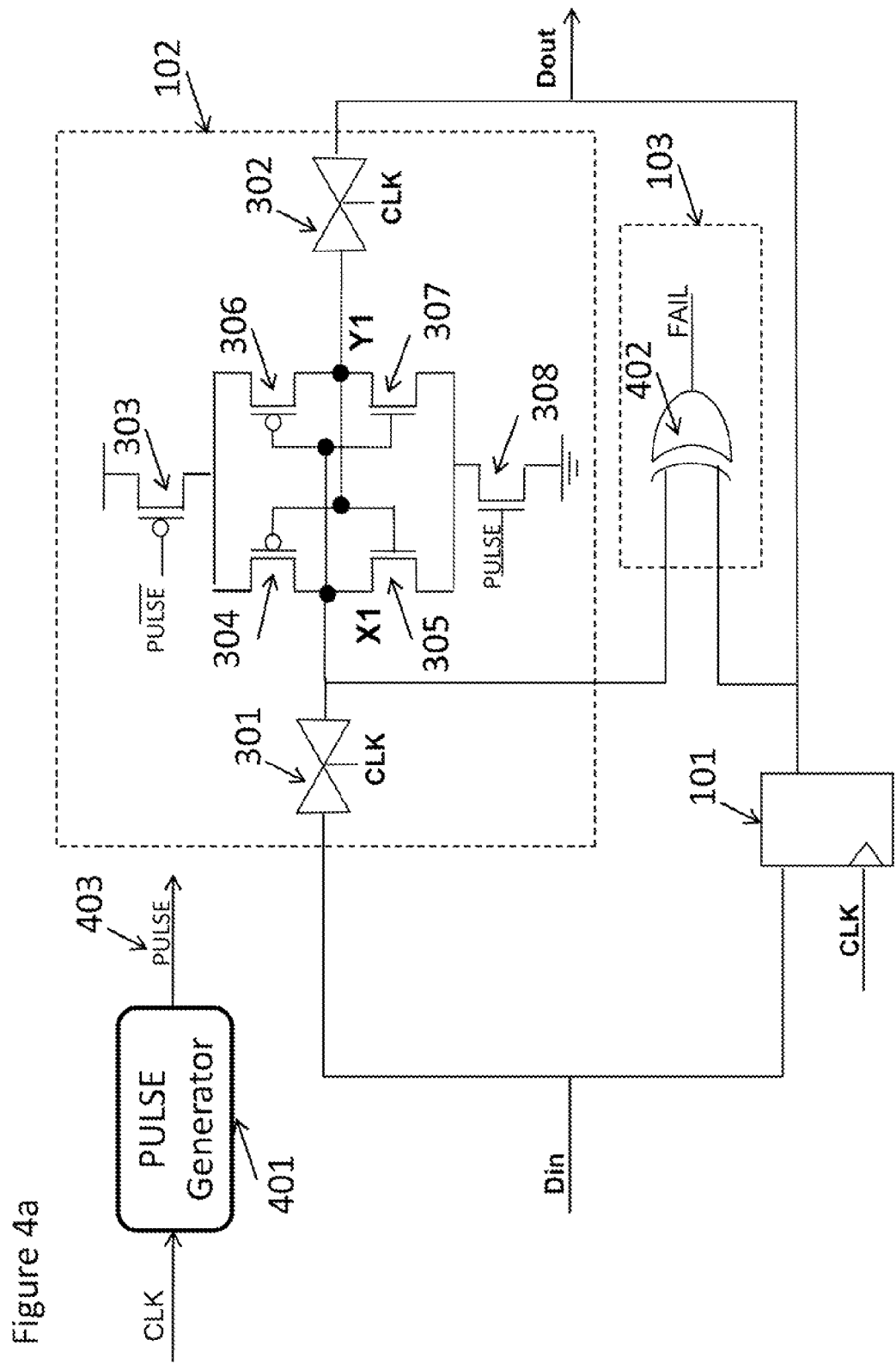
FIG. 4a is a diagram of a system including circuitry of an error detection circuit according to an embodiment.

FIG. 4a is a diagram that includes an embodiment of the detection circuit 103. It is appreciated that the circuitry of FIG. 4a is similar to the circuitry of FIG. 3 except that the gate terminal of the p-channel transistor 303 receives an inverted pulse signal, and the gate terminal of the first n-channel transistor 308 receives a pulse signal at its gate. The circuitry may further include a pulse generator 401, which receives the clock signal as its input and generates the pulse signal 403 at its output.

The pulse generator 401 may generate a pulse 403 from the clock signal. In an embodiment, the pulse signal is generated for a period in response to an operable clock edge. For example, the start of the pulse signal may be triggered by an operable clock edge, and the pulse may be held for a predetermined period. In FIG. 4a, the differential amplifier 205 may be enabled, and the difference between the first node X1 and the second node Y1 amplified and held for the duration of the pulse. It is appreciated that in an embodiment, the pulse may be asserted for a period corresponding to at least part of the period for which the clock signal is high.

The operation of the circuit of FIG. 4a is similar to that as described by FIGS. 5a and 5b, except that the differential amplifier is enabled for the duration of the pulse instead of for the duration of the clock signal being high. In an embodiment, the differential amplifier may only be enabled for part of the period for which the clock signal is high. It is appreciated that in another embodiment, the falling edge of the clock may be the operable clock edge, and a pulse may be generated corresponding thereto. The pulse may correspond to a period associated with an operable clock edge.

The period for which the clock pulse is asserted may be predetermined. In an embodiment, the period may correspond to the period for which the clock signal is high or low (depending on the operable clock edge). Alternatively the period may be only part thereof.

It is appreciated that the duration of the pulse may be set in accordance with the requirements of specific implementations of the circuit, for example, characteristics of circuit components, timing margins required and/or settling times required for the circuitry.

Similar to the circuitry of FIG. 3, the first node X1 of FIG. 4a may provide a value corresponding to a value D of the data input signal Din at an operable clock edge for the duration of the pulse. In an embodiment per FIG. 4a, the error detection circuit 103 includes an XOR gate 402, which receives a first input from the first node X1 and a second input from the data output signal Dout of the data latch 101. The XOR gate 402 compares the first and second input and generates the fail signal corresponding to a difference between the inputs.

In an embodiment, a fail signal may only be captured during the duration of the pulse, or at a predetermined time after an operable clock edge, to allow settling of the signals from the amplify and hold circuit 205 and data latch 101. This may prevent capture of the fail signal when the first node X1 is following the data input signal Din. Additionally or alternatively, in an embodiment, the detection circuit 103 may only be enabled and/or active during a period for which the fail signal is valid. It is appreciated that the capturing of the fail signal may be dependent on a specific implementation of the circuitry in an embodiment. For example, the fail signal may be captured at predetermined times corresponding to when the comparison is made between the data input to a data latch 101 at a clock edge and the data subsequently output from the data latch 101.

Figure 4B:
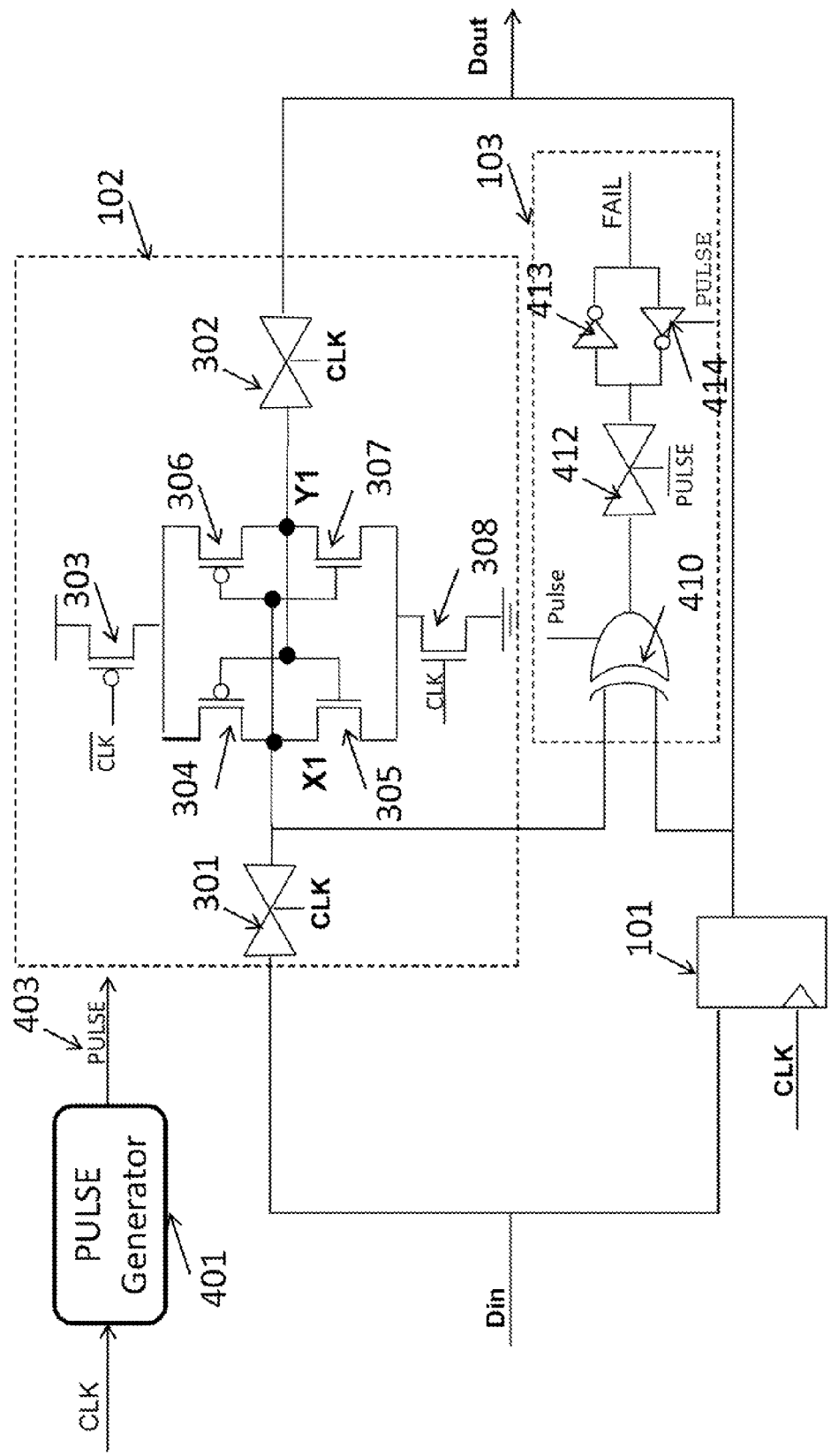
FIG. 4b is a diagram of a system including circuitry of an error detection circuit according to another embodiment.

FIG. 4b is a diagram that includes another embodiment of the error detection circuit 103. In this embodiment, a shadow latch 102 is similar to that of FIG. 3, and the first p-channel transistor 303 and first n-channel transistor 308 may receive an inverted clock signal and clock signal at their respective gates. A clock pulse generator 401 may generate a clock pulse 403 similarly to FIG. 4a.

The error detection circuit 103 of FIG. 4b may include an XOR gate 410, which receives the pulse signal 403 as a control input. An output of the XOR gate 410 is coupled to a first connection of a switch 412. The switch 412 may receive an inverted pulse signal as a control input. A second connection of the switch 412 may be coupled to an input of a first inverter 413 and an output of a second inverter 414. The input of the first inverter 413 may be further coupled to the output of the second inverter 414 and the input of the second inverter 414 may be coupled to the output of the first inverter 413. The second inverter 414 may receive the pulse signal as a control input.

In operation, the pulse signal may enable the XOR gate 410. For the duration of the pulse, the XOR gate may compare the value at the first node X1 and the data signal output Dout and generate an output indicating a detected difference. While the pulse is asserted, the switch 412 may be off. When the pulse is de-asserted, the switch 412 may turn on and couple the output of the XOR gate 410 to the inverter circuit. The first 413 inverter may hold the initial value from the output of the XOR gate 410 to provide the fail signal. When the pulse is asserted, the second inverter 414 may become active, and the first inverter 413 and second inverter 414 may act as a latch to hold the value of the fail signal when the switch 412 is off.

The XOR gate 410, switch 412, and inverters 413 and 414 may form domino logic. In an embodiment, a timing requirement for the capture of the comparison of the value at node X1 and value of the data output signal Q−1 may be set by the pulse. In an embodiment, the timing requirement may be less than a settling time of the data output signal. The error detection circuit 103 may determine whether the data latch 101 outputs a correct value within the given time requirement.

Alternatively, as described with reference to FIG. 4c, the error detection circuitry may be implemented with a metastability detector.

Figure 4C:
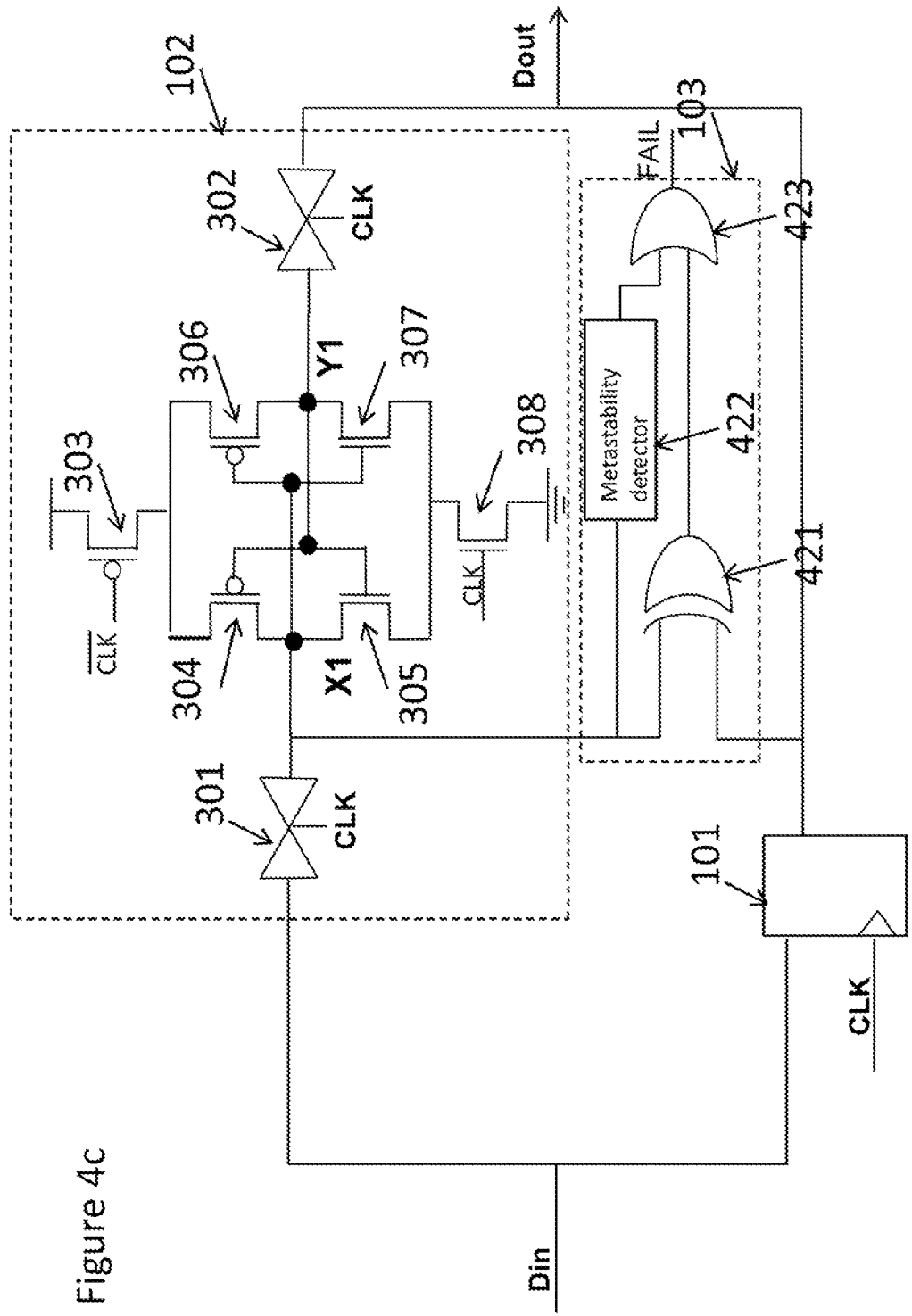
FIG. 4c is a diagram of a system including circuitry of an error detection circuit according to yet another embodiment.

FIG. 4c is a diagram that includes an embodiment of circuitry for the error detection circuit 103. A shadow latch of FIG. 4c may be similar to that of FIG. 3 and in this embodiment, a clock pulse may not be generated. The error detection circuit 103 may include an XOR gate 421, which receives a first input from the first node X1 and a second input of the data output signal Dout. An output of the XOR gate 421 may provide a first input to an OR gate 423. The output of the OR gate 423 may provide the fail signal. The first node X1 may be coupled to an input of a metastability detector 422. The output of the metastability detector 422 may provide a second input to the OR gate 423.

In operation, the XOR gate 421 receives the value at the first node X1 and the value Q−1 of data output signal Dout and compares them. The result of the comparison is input into the OR gate 423. The metastability detector 422 detects whether or not the value at the first node X1 has settled yet, or if it is in a state of metastability. The OR gate 423 asserts the fail signal if the output from the XOR gate 421 indicates that the value at the first node X1 and the data latch output are different and the metastability detector 422 indicates that the value at the first node X1 is stable.

In an embodiment, it is appreciated that the error detection circuit 103 may only be enabled during at least part of a period in which the amplify and hold circuitry 205 is enabled. Alternatively or additionally, further circuitry may be configured to capture the fail signal from the error detection circuitry 103 at valid times to prevent the capture of a fail signal generated based on the first node following the data input signal Din. It is appreciated that suitable clocking instants and duration may be chosen accordingly.

In an embodiment, a system may include more than one data latch. Some data latches may form part of a critical path, and the shadow latch may be implemented with these critical path latches. In an embodiment, a shadow latch may be provided for each critical path latch, while in others a shadow latch may be provided with only some of the critical path latches.

It is appreciated that throughout the detailed description, the term latch has been used to refer to data path sequential logic. It is appreciated that this is for clarity in reading the disclosure only, and the term latch may encompasses flip-flops or other types of latches and/or equivalent circuit components.

It is appreciated that the shadow latch and error detection circuitry have been described as being separate circuitry. It is appreciated that in an embodiment, the error detection circuitry may form part of the shadow latch. It is also appreciated that in an embodiment, the shadow latch may not be separate from the sequential logic. For example, the circuitry of the foregoing may be integrated onto a single integrated circuit or may form multiple integrated circuits.

It is also be appreciated that while some embodiments describe n-channel and p-channel MOSFETs, other types or topologies of transistors may be used in the implementation of an embodiment. For example, n-channel or p-channel transistors may be replaced by respective p-channel or n-channel transistors with minor modification to the circuit.

It is appreciated that the fail signal may be passed to further circuitry that may correct the error and/or provide information of the error to circuitry such as adaptive scaling circuitry. The fail signal in an embodiment may be used to record information and instances of an error.

It is appreciated that an embodiment may be implemented in systems making use of dynamic voltage scaling. In an embodiment, system parameters may be scaled in order to bring the system as close to failure as possible in order to achieve, for example, power savings or improved system speed. In an embodiment, the system may be scaled such that the system is in semi-failure. For example, some latches may fail in the system. This may lead to improved power savings if, for example, the power required to recover from the failure is less than the extra power required to prevent failure in all the latches. A failure or error detected in a latch may be used to recover from the error. In an embodiment, the failure signals from all or some latches in the system may be used to determine whether the level of failure in the system is acceptable (for example, the recovery power does not exceed the extra power required for no failure). For example, a system may be set to have 10 failing flip-flops in 100 if the failure recovery power is less than the power saved by having 10 flip-flops in failure instead of zero flip-flops in failure.

In an embodiment, an integrated circuit may include an embodiment of the circuitry of FIG. 2, 3, 4a, 4b, or 4c, and such an integrated circuit may be coupled to another integrated circuit (which may or may not include an embodiment of the circuitry of FIG. 2, 3, 4a, 4b, or 4c) to form a system. The integrated circuits may be disposed on the same die or on respective dies, and one of the integrated circuits may be a controller such as a microprocessor or microcontroller. Examples of such a system include a computer system, smart phone, or other electronic system.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
a logic circuit configured to receive an input signal having an input value and to generate an output signal having an output value that corresponds to the input value; and
an error detector having:
a comparator configured to compare the input value to the output value and configured to indicate whether the output value corresponds to the input value; and
an amplifier having a first node configured to receive the input signal and a second node configured to receive the output signal, the amplifier configured to amplify a difference between the input value and the output value.

2. The apparatus of claim 1 wherein the logic circuit includes a sequential logic circuit.

3. The apparatus of claim 1 wherein the logic circuit includes a latch.

4. The apparatus of claim 1 wherein the logic circuit is configured to generate the output signal in response to an edge of a clock signal.

5. The apparatus of claim 1 wherein the logic circuit is configured to generate the output signal having an output value that approximately equals the input value.

6. The apparatus of claim 1 wherein:
the logic circuit is configured to generate the output signal in response to an edge of a clock signal; and
the error detector is configured to indicate that the output value does not correspond to the input value if the input signal transitions to the input value less than a set-up time of the logic circuit before the edge of the clock.

7. The apparatus of claim 1 wherein the amplifier comprises a differential amplifier having a first amplifier node coupled to receive the input signal and a second amplifier node coupled to receive the output signal.

8. The apparatus of claim 1 wherein the amplifier comprises a differential amplifier having a first amplifier node coupled to receive the input signal and a second amplifier node coupled to receive the output signal, the differential amplifier being unbalanced in favor of the first amplifier node.

9. The apparatus of claim 1 wherein:
the amplifier is configured to receive the input signal while a clock has a first level and configured to receive the output signal while the clock has the first level, the amplifier configured to amplify a signal across the first and second amplifier nodes while the clock has a second level; and
the comparator having a first input node coupled to the first amplifier node, having a second input node configured to receive the output signal, and the comparator configured to generate a signal that indicates whether the output value corresponds to the input value.

10. The apparatus of claim 1 wherein:
the amplifier is configured to receive the input signal while a clock has a first level, and configured to receive the output signal while the clock has the first level, the amplifier configured to amplify a signal across the first and second amplifier nodes for a time that is less than a time during which the clock has a second level; and the comparator having a first input node coupled to the first amplifier node, having a second input node configured to receive the output signal, and the comparator configured to generate a signal that indicates whether the output value corresponds to the input value.

11. The apparatus of claim 1 wherein:

the amplifier is configured to receive the input signal while a clock has a first level and configured to receive the output signal while the clock has the first level, the amplifier configured to amplify a signal across the first and second amplifier nodes while the clock has a second level; and the error detector further comprises an exclusive-or gate having a first input node coupled to the first amplifier node, having a second input node configured to receive the output signal, and the exclusive-or gate configured to generate a signal that indicates whether the output value corresponds to the input value.

12. The apparatus of claim 1 wherein:

the amplifier is configured to receive the input signal while a clock has a first level, and configured to receive the output signal while the clock has the first level, the amplifier configured to amplify a signal across the first and second amplifier nodes while the clock has a second level; and the comparator circuit having a first input node coupled to the first amplifier node, having a second input node configured to receive the output signal, a stability detector configured to determine whether a signal on the first amplifier node is stable, and the comparator circuit configured to generate a signal that indicates whether the output value corresponds to the input value.

13. An apparatus, comprising:

a logic circuit configured to receive an input signal having an input value and to generate an output signal having an output value that corresponds to the input value; and an error detector configured to indicate whether the output value corresponds to the input value;

wherein the error detector includes:

an intermediate node;

a comparator having a first comparator-input node coupled to receive the output signal, having a second comparator-input node, and configured to generate a signal that indicates whether the output value corresponds to the input value;

a differential amplifier having first and second amplifier nodes;

a first switch configured to couple the input signal to the second comparator-input node while a clock signal has a first level and to uncouple the input signal from the second comparator-input node while the clock signal has a second level;

a second switch configured to couple the second comparator-input node to the first amplifier node while the clock signal has the second level and to uncouple the second comparator-input node from the first amplifier node while the clock signal has the first level;

a third switch configured to couple the output signal to the intermediate node while the clock signal has the first level and to uncouple the input signal from the intermediate node while the clock signal has the second level; and a fourth switch configured to couple the intermediate node to the second amplifier node while the clock signal has the second level and to uncouple the intermediate node from the second amplifier node while the clock signal has the first level.

14. An integrated circuit, comprising:

a logic circuit configured to receive an input signal having an input value and to generate an output signal having an output value that corresponds to the input value; and an error detector having:

a comparator configured to compare the input value to the output value and configured to indicate whether the output value corresponds to the input value; and an amplifier having a first node configured to receive the input signal and a second node configured to receive the output signal, the amplifier configured to amplify a difference between the input value and the output value.

15. A system, comprising:

a first integrated circuit, including:

a logic circuit configured to receive an input signal having an input value and to generate an output signal having an output value that corresponds to the input value; and an error detector having:

a comparator configured to compare the input value to the output value and configured to indicate whether the output value corresponds to the input value; and an amplifier having a first node configured to receive the input signal and a second node configured to receive the output signal, the amplifier configured to amplify a difference between the input value and the output value; and a second integrated circuit coupled to the first integrated circuit.

16. The system of claim 15 wherein one of the first and second integrated circuits includes a controller.

17. The system of claim 15 wherein the first and second integrated circuits are disposed on a same die.

18. The system of claim 15 wherein the first and second integrated circuits are disposed on respective dies.

19. A method, comprising:

causing an output signal to have an output value in response to an input signal;

comparing the output signal to the input signal through an imbalanced differential amplifier; and determining whether the output value corresponds to an input value of the input signal.

20. The method of claim 19 wherein causing the output signal to have the output value includes causing the output signal to have the output value in response to a transition of a clock signal from a clock level to another clock level.

21. The method of claim 19 wherein determining whether the output value corresponds to the input value of the input signal includes determining whether the output value approximately equals the input value.

22. The method of claim 19 wherein determining whether the output value corresponds to the input value of the input signal includes determining whether the output value corresponds to the input value approximately during a time that a clock signal transitions from a clock level to another clock level.

23. The method of claim 19 wherein determining whether the output value corresponds to the input value of the input signal includes:

amplifying the input signal; and determining whether the output value corresponds to a value of the amplified input signal.

24. The method of claim 19 wherein determining whether the output value corresponds to the input value of the input signal includes:
- amplifying a difference between the input signal and a previous output value of the output signal; and
- determining whether the output value corresponds to a value of the amplified difference.

25. An apparatus, comprising:
- a logic circuit configured to receive an input signal having an input value and to generate an output signal having an output value that corresponds to the input value;
- a first switch coupled to receive the input signal and configured to generate a clocked input signal;
- a second switch coupled to receive the output signal and configured to generate a clocked output signal; and
- a comparator having a first comparator-input node coupled to receive the clocked output signal, having a second comparator-input node coupled to receive the clocked input signal, and configured to generate a signal that indicates whether the output value corresponds to the input value.

* * * * *